United States Patent
Yamato et al.

(10) Patent No.: US 9,728,585 B1
(45) Date of Patent: Aug. 8, 2017

(54) SEMICONDUCTOR MEMORY DEVICE

(71) Applicant: KABUSHIKI KAISHA TOSHIBA, Minato-ku, Tokyo (JP)

(72) Inventors: Masaki Yamato, Mie (JP); Takeshi Yamaguchi, Mie (JP); Takeshi Takagi, Mie (JP); Natsuki Fukuda, Mie (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/270,682

(22) Filed: Sep. 20, 2016

Related U.S. Application Data

(60) Provisional application No. 62/306,950, filed on Mar. 11, 2016.

(51) Int. Cl.
*H01L 47/00* (2006.01)
*H01L 27/24* (2006.01)
*H01L 23/528* (2006.01)
*H01L 45/00* (2006.01)

(52) U.S. Cl.
CPC .......... *H01L 27/249* (2013.01); *H01L 23/528* (2013.01); *H01L 45/1233* (2013.01); *H01L 45/146* (2013.01); *H01L 45/1683* (2013.01)

(58) Field of Classification Search
CPC ................ H01L 27/249; H01L 23/528; H01L 45/1233; H01L 45/146; H01L 45/1683
USPC .......................................................... 257/4
See application file for complete search history.

(56) References Cited

U.S. PATENT DOCUMENTS

| | | | |
|---|---|---|---|
| 8,450,713 B2 | 5/2013 | Awaya et al. | |
| 8,912,521 B2 | 12/2014 | Nojiri et al. | |
| 9,502,103 B1* | 11/2016 | Tijerina | G11C 13/0007 |
| 2013/0200331 A1 | 8/2013 | Morikawa et al. | |
| 2013/0229846 A1 | 9/2013 | Chien et al. | |
| 2014/0061574 A1 | 3/2014 | Pio | |
| 2014/0061577 A1 | 3/2014 | Kanno et al. | |
| 2015/0179705 A1 | 6/2015 | Wouters et al. | |
| 2015/0206580 A1 | 7/2015 | Toriyama | |

* cited by examiner

*Primary Examiner* — Tu-Tu Ho
(74) *Attorney, Agent, or Firm* — Foley & Lardner LLP

(57) ABSTRACT

A semiconductor memory device according to an embodiment includes: a semiconductor substrate which extends in first and second directions that intersect each other; a plurality of first wiring lines which are arranged in a third direction that intersects the first direction and the second direction, and which extend in the first direction; a plurality of second wiring lines which are arranged in the first direction and extend in the third direction; and a plurality of memory cells disposed at intersections of the first wiring lines and the second wiring lines, one of the memory cells having a first film whose resistance changes electrically, a thickness in the second direction of the first film changing with respect to a change of position in the third direction, and the first films of two of the memory cells adjacent in the third direction being separated between the two memory cells.

13 Claims, 11 Drawing Sheets

SEMICONDUCTOR MEMORY DEVICE

CROSS-REFERENCE TO RELATED APPLICATIONS

This application is based upon and claims the benefit of priority from the prior U.S. Provisional Application 62/306,950, filed on Mar. 11, 2016, the entire contents of which are incorporated herein by reference.

BACKGROUND

Field

Embodiments of the present invention relate to a semiconductor memory device.

Description of the Related Art

A flash memory is a semiconductor memory device known for its low cost and large capacity. One example of a semiconductor memory device to replace the flash memory is a variable resistance type memory (ReRAM: Resistance RAM) which employs a variable resistance film in its memory cell. The ReRAM can configure a cross-point type memory cell array, hence can achieve an increased capacity similarly to the flash memory. Moreover, in order to further increase capacity, there is also being developed a ReRAM having a so-called VBL (Vertical Bit Line) structure in which bit lines which are selection wiring lines are arranged in a perpendicular direction to a semiconductor substrate.

DETAILED DESCRIPTION

A semiconductor memory device according to an embodiment includes: a semiconductor substrate which extends in first and second directions that intersect each other; a plurality of first wiring lines which are arranged in a third direction that intersects the first direction and the second direction, and which extend in the first direction; a plurality of second wiring lines which are arranged in the first direction and extend in the third direction; and a plurality of memory cells disposed at intersections of the first wiring lines and the second wiring lines, one of the memory cells having a first film whose resistance changes electrically, a thickness in the second direction of the first film changing with respect to a change of position in the third direction, and the first films of two of the memory cells adjacent in the third direction being separated between the two memory cells.

Semiconductor memory devices according to embodiments will be described below with reference to the drawings.

First Embodiment

First, an overall configuration of a semiconductor memory device according to a first embodiment will be described.

Figure 1:
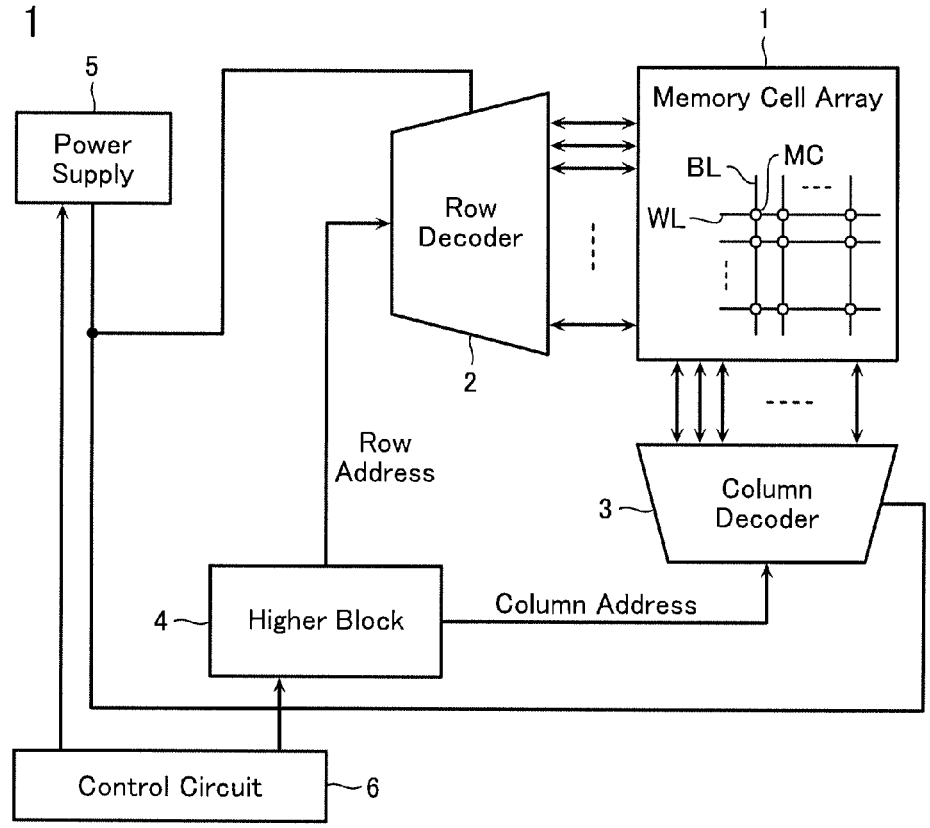
FIG. 1 is a view showing functional blocks of a semiconductor memory device according to a first embodiment.

FIG. 1 is a view showing functional blocks of the semiconductor memory device according to the present embodiment.

As shown in FIG. 1, the semiconductor memory device of the present embodiment comprises: a memory cell array 1; a row decoder 2; a column decoder 3; a higher block 4; a power supply 5; and a control circuit 6.

The memory cell array 1 includes: a plurality of word lines WL and a plurality of bit lines BL; and a plurality of memory cells MC selected by these word lines WL and bit lines BL. The row decoder 2 selects the word line WL during an access operation. The column decoder 3 selects the bit line BL during an access operation, and includes a driver that controls the access operation. The higher block 4 selects the memory cell MC which is to be an access target in the memory cell array 1. The higher block 4 provides a row address and a column address to, respectively, the row decoder 2 and the column decoder 3. The power supply 5, during write/read of data, generates certain combinations of voltages corresponding to respective operations, and supplies these combinations of voltages to the row decoder 2 and the column decoder 3. The control circuit 6 performs control of the likes of sending the addresses to the higher block 4, and, moreover, performs control of the power supply 5, based on a command from external.

Next, an outline of the memory cell array 1 will be described. Hereafter, the memory cell array 1 of the present embodiment will sometimes also be distinguished from another embodiment and be described assigned with a reference symbol 100.

Figure 2:
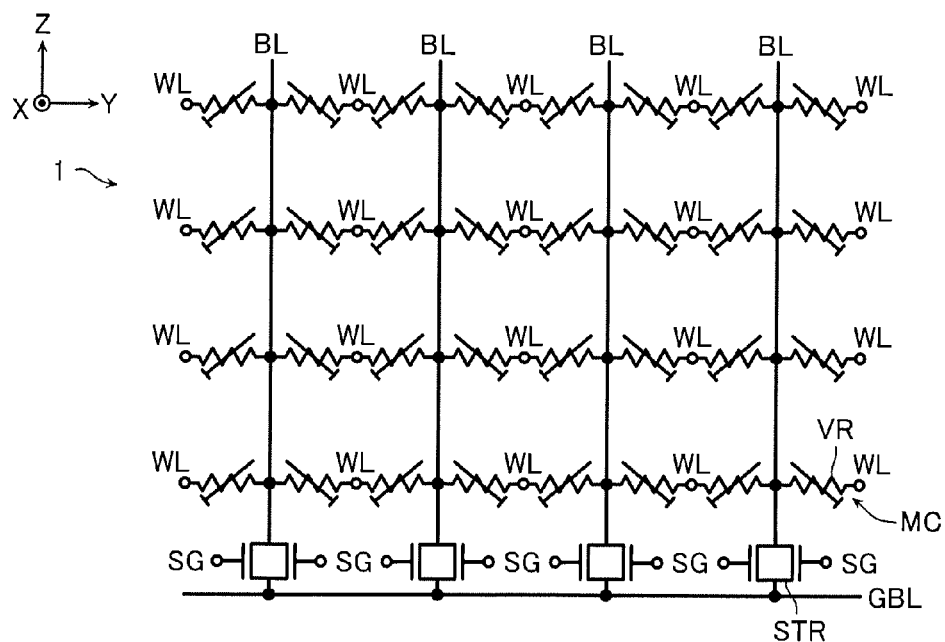
FIG. 2 is a circuit diagram of a memory cell array of the semiconductor memory device according to the same embodiment.

FIG. 2 is a circuit diagram of the memory cell array of the semiconductor memory device according to the present embodiment.

As shown in FIG. 2, the memory cell array 1 includes: the word lines WL extending in an X direction; the bit lines BL extending in a Z direction; and the memory cells MC disposed at intersections of the word lines WL and the bit lines BL. In addition, the memory cell array 1 includes a plurality of global bit lines GBL. The bit lines BL arranged in a Y direction, of the bit lines BL, are commonly connected to one of the global bit lines GBL via a select transistor STR. Each of the select transistors STR is controlled by a select gate line SG.

Next, a structure of the memory cell array 100 will be described.

Figure 3:
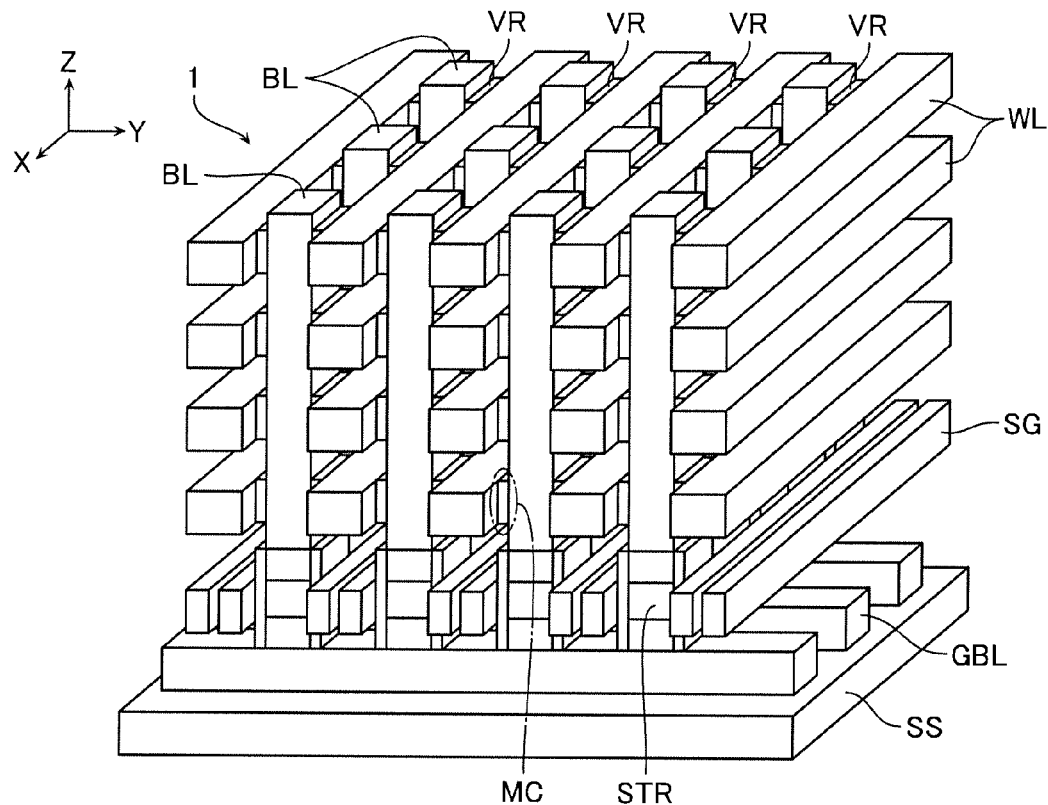
FIG. 3 is a schematic perspective view of the memory cell array of the semiconductor memory device according to the same embodiment.

FIG. 3 is a perspective view of the memory cell array of the semiconductor memory device according to the present embodiment. To make it easy to understand an electrical structure of the memory cell array 100, FIG. 3 omits the likes of an inter-layer insulating film between wiring lines. In addition, FIG. 4 is a cross-sectional view in the Y-Z directions of a memory cell periphery of the memory cell array of the same semiconductor memory device.

As shown in FIG. 3, the memory cell array 100 has a so-called VBL (Vertical Bit Line) structure in which the bit line BL extends perpendicularly to a semiconductor substrate SS extending in the X-Y directions. In other words, the word lines WL are arranged in a matrix in the Y direction and the Z direction, and each extend in the X direction. The bit lines BL are arranged in a matrix in the X direction and the Y direction, and extend in the Z direction. Moreover, each of the memory cells MC is disposed at each of the intersections of these word lines WL and bit lines BL. In other words, the memory cells MC are arranged in a three-dimensional matrix in the X direction, the Y direction, and the Z direction. Note that as shown in FIG. 4, two of the word lines WL adjacent in the Z direction are electrically insulated by an inter-layer insulating film 101 disposed between those word lines WL. Now, the word line WL is formed by titanium nitride (TiN) or tungsten (W), for example. The bit line BL is formed by polysilicon (Poly-Si), for example. The inter-layer insulating film 101 is formed by silicon oxide ($SiO_2$), for example.

Figure 4:
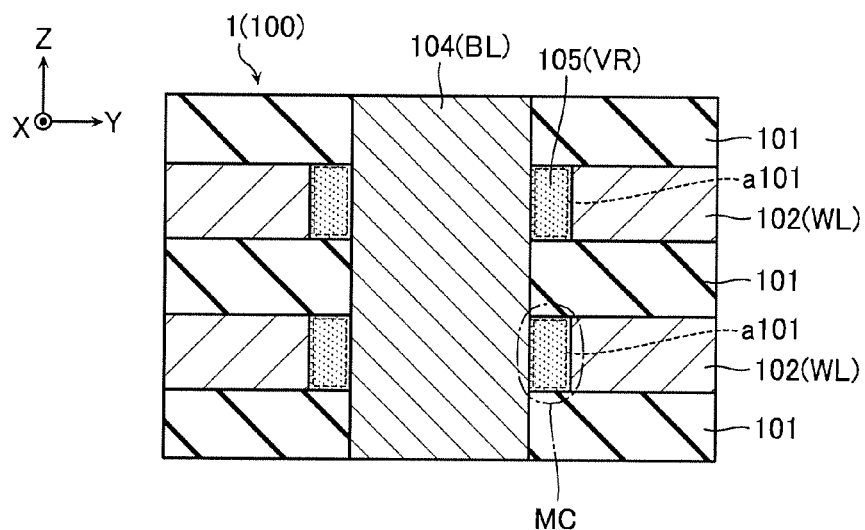
FIG. 4 is a cross-sectional view of a memory cell periphery of the memory cell array of the semiconductor memory device according to the same embodiment.
Figure 5:
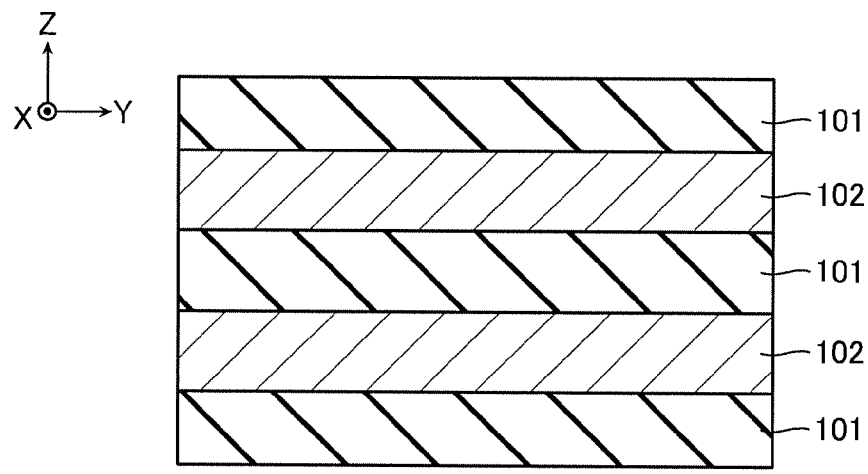
FIGS. 5 to 9 are cross-sectional views describing manufacturing steps of the memory cell array of the semiconductor memory device according to the same embodiment.

As shown in FIG. 4, each of the memory cells MC includes a variable resistance film VR. Now, the variable resistance film VR is formed by a material whose resistance value changes electrically, and is formed by hafnium oxide ($HfO_2$), for example. Now, a side surface facing the bit line BL of the word line WL is formed at a position more separated in the Y direction from the bit line BL than a side surface facing the bit line BL of the inter-layer insulating film 101 is, whereby there is a place a101 at an end of each of the word lines WL. Moreover, the variable resistance film VR of the memory cell MC is disposed in this place a101. In addition, a side surface facing the bit line BL of the variable resistance film VR is formed in an identical plane to a side surface facing the bit line BL of the inter-layer insulating film 101. In other words, the variable resistance films VR of two of the memory cells MC adjacent in the Z direction are separated by the inter-layer insulating film 101. Moreover, each of the variable resistance films VR has a height in the Z direction from a position of a bottom surface of one of the two inter-layer insulating films 101 sandwiching each of the word lines WL to a position of an upper surface of the other of the two inter-layer insulating films 101 sandwiching each of the word lines WL. When the likes of a barrier metal film are not disposed between the word line WL and the inter-layer insulating film 101 as in FIG. 4, each of the variable resistance films VR and each of the word lines WL have the same height in the Z direction. Moreover, a film thickness in the Y direction of each of the variable resistance films VR is roughly constant with respect to a change of position in the Z direction.

Next, manufacturing steps of the memory cell array 100 will be described.

FIGS. 5 to 9 are cross-sectional views in the Y-Z directions describing the manufacturing steps of the memory cell array of the semiconductor memory device according to the present embodiment.

First, a plurality of the inter-layer insulating films 101 and conductive films 102 are stacked alternately on an unillustrated semiconductor substrate. Now, the inter-layer insulating film 101 is formed by silicon oxide ($SiO_2$), for example. The conductive film 102 is formed by titanium nitride (TiN) or tungsten (W), for example, and functions as the word line WL.

Figure 6:
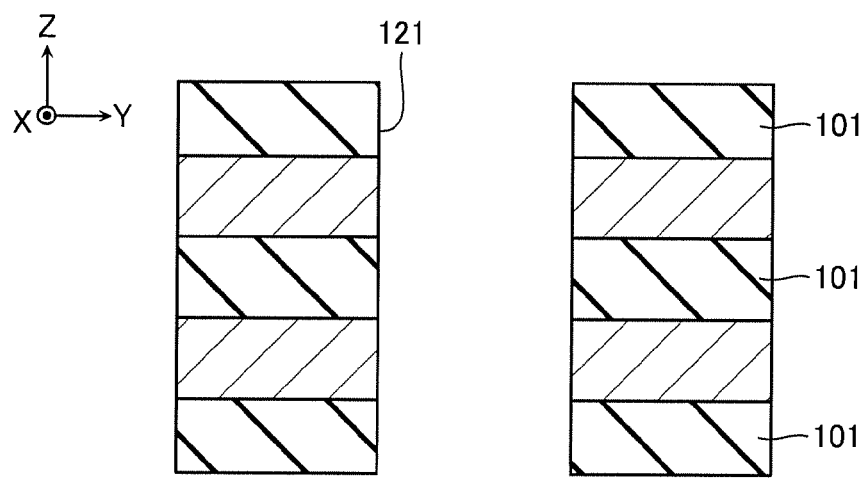

Then, as shown in FIG. 6, a trench 121 having the Z direction as its depth direction and having the X direction as its extension direction is formed in a stacked body of the inter-layer insulating films 101 and the conductive films 102, by anisotropic etching.

Figure 7:
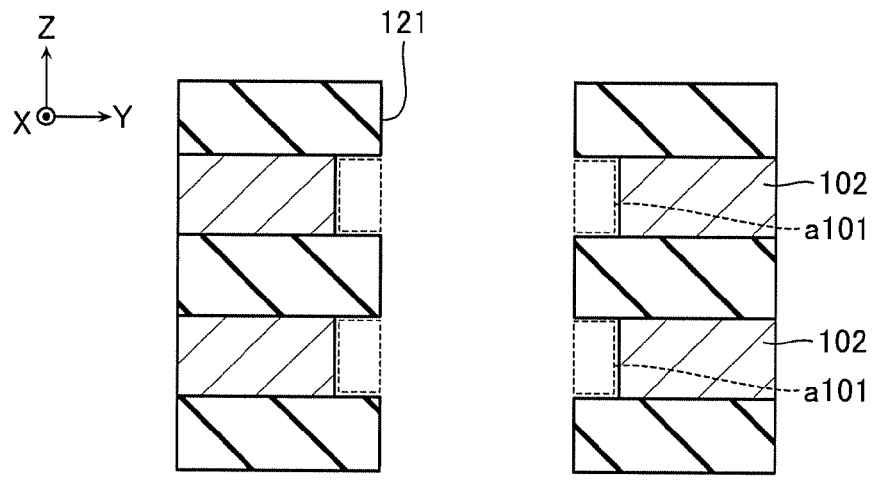

Next, as shown in FIG. 7, an end (the place a101) of the conductive film 102 exposed in the trench 121 is recessed only as much as a film thickness of the variable resistance film VR, by isotropic etching via the trench 121.

Figure 8:
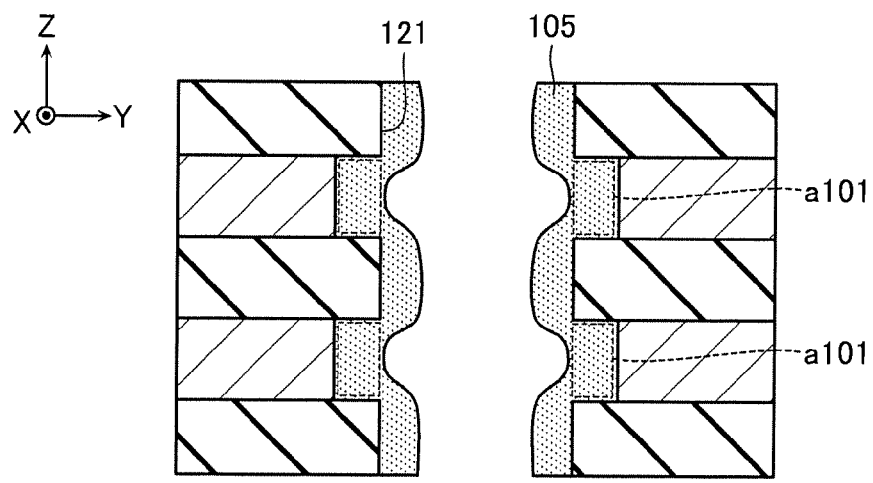

Then, as shown in FIG. 8, a variable resistance film 105 is deposited on a side surface of the trench 121, and the variable resistance film 105 is implanted in the place a101. Now, the variable resistance film 105 is formed by a material whose resistance value changes electrically, is formed by hafnium oxide ($HfO_2$), for example, and functions as the variable resistance film VR.

Figure 9:
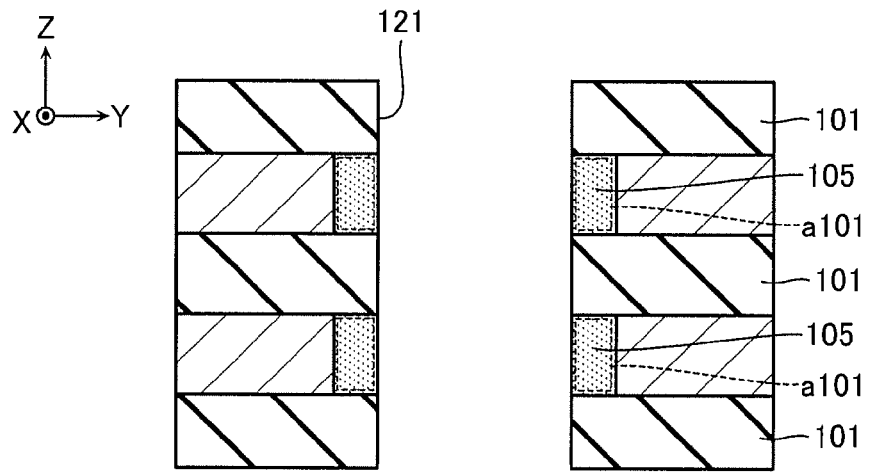

Next, as shown in FIG. 9, the variable resistance film 105 is removed excluding a portion implanted in the place a101, by anisotropic etching via the trench 121. As a result, the variable resistance film 105 is separated by the inter-layer insulating film 101.

Finally, the trench 121 on whose side surface the variable resistance film 105 remains, is implanted with an unillustrated conductive film 104. This conductive film 104 is formed by polysilicon (Poly-Si), for example, and functions as the bit line BL.

As a result of the manufacturing steps above, the memory cell array 100 shown in FIG. 4 is formed.

Next, advantages of the present embodiment will be described.

In the case of the structure of the memory cell array of the present embodiment, the variable resistance films VR of the memory cells MC arranged in the Z direction are separated on a word line WL basis. In this case, contrary to the case where the variable resistance films VR of these memory cells MC are formed integrally, short-circuiting between the word lines WL via the variable resistance film VR can be avoided.

In addition, in the case of the manufacturing steps of the memory cell array of the present embodiment, as shown in FIG. 7, the conductive film 102 (word line WL) is recessed to be implanted with the variable resistance film 105 (VR). In this case, a width in the Y direction of the trench 121 is not spoiled by disposition of the variable resistance film 105, hence a process space of the conductive film 104 (bit line BL) can be secured. As a result, miniaturization of the memory cell array 100 becomes easy.

Furthermore, the case of the manufacturing steps of the memory cell array of the present embodiment has several advantages over the case where the end of the conductive film which is to be the word line is oxidized to form the variable resistance film. First, there is no limitation of a combination of materials of the conductive film 102 and the variable resistance film 105. For example, even when the conductive film 102 is formed by titanium nitride (TiN), the variable resistance film 105 can be formed by an oxide ($HfO_2$) of hafnium (Hf) which is different from the titanium (Ti) included in the conductive film 102. Of course, it is also possible for the variable resistance film 105 to be formed by titanium oxide ($TiO_2$) in this case. Second, control of film thickness of the variable resistance film 105 is easier than when the conductive film is oxidized. Third, there is no need to oxidize the conductive film, hence the conductive film can be formed by a material which is difficult to oxidize.

As is clear from the above, the present embodiment makes it possible to provide a semiconductor memory device in which short-circuiting defects between word lines are reduced and there is no limitation of the combination of materials of the conductive film (word line) and the variable resistance film.

Second Embodiment

The first embodiment described a semiconductor memory device comprising a memory cell array 100 in which the film thickness in the Y direction of the variable resistance film VR was roughly constant. In contrast, a second embodiment describes a semiconductor memory device comprising a memory cell array 1 in which the film thickness in the Y direction of the variable resistance film VR is not uniform. Note that to distinguish from a memory cell array 1 of another embodiment, the memory cell array 1 of the present embodiment will be assigned with a reference symbol 200.

FIGS. 10 to 16 are cross-sectional views in the Y-Z directions of a memory cell periphery of the memory cell array of the semiconductor memory device according to the present embodiment.

The memory cell array 200 of the present embodiment includes a variable resistance film VR having a thinnest portion p201 where a width in the Y direction has become thinnest at a certain position in the Z direction. When a forming operation for forming a filament path is executed on such a variable resistance film VR, a thin film portion of the variable resistance film VR is applied with a strongest electric field, hence it becomes easy for a filament to be formed in the thinnest portion. In other words, by controlling a place of the thinnest portion of the variable resistance film VR, a place of the filament can also be controlled to a certain extent.

Figure 10:
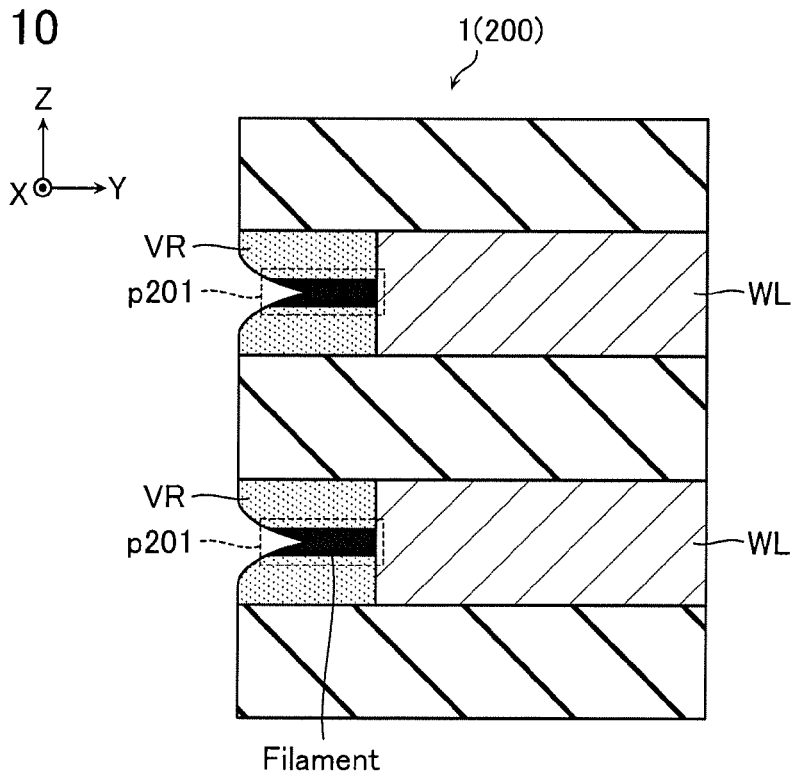
FIGS. 10 to 16 are cross-sectional views of a memory cell periphery of a memory cell array of a semiconductor memory device according to a second embodiment.
Figure 11:
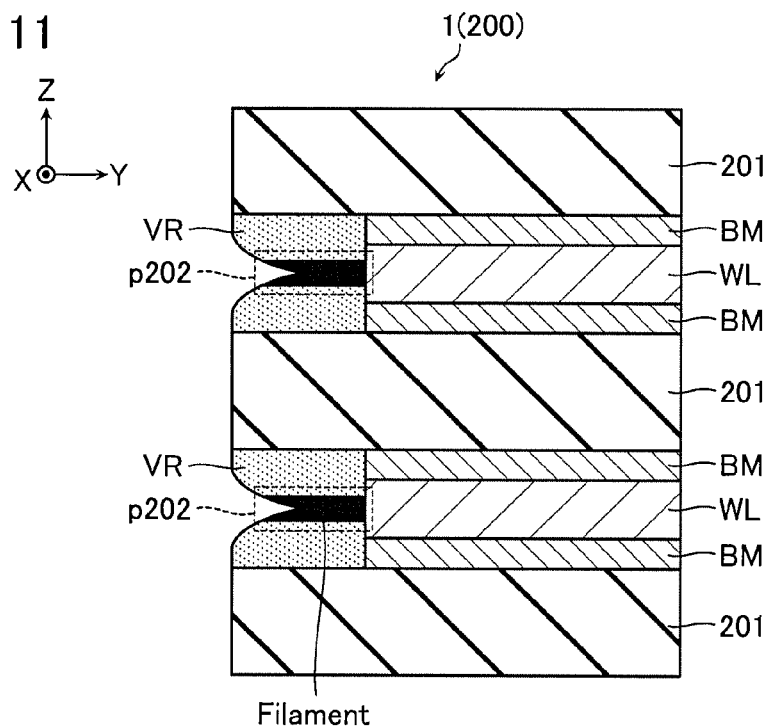

First, FIG. 10 is an example where the thinnest portion p201 of the variable resistance film VR is formed at a center in the Z direction of the variable resistance film VR. In this case, as shown in FIG. 10, the filament becomes more easily formed at the center in the Z direction of the variable resistance film VR. For example, when it is desired to form the word line WL by tungsten (W), a barrier metal film BM formed by the likes of titanium nitride (TiN) is sometimes disposed at both interfaces of an inter-layer insulating film 201 (corresponding to 101 of FIG. 4) and an upper surface and bottom surface of the word line WL. In such a case, if the thinnest portion p201 is formed beforehand at the center of the variable resistance film VR, then as shown in FIG. 11, the filament can be disposed avoiding the barrier metal film BM. As a result, the filament can be contacted with the word line WL whose work function is smaller than that of the barrier metal film BM.

Note that the variable resistance film VR having a non-uniform film thickness in the Y direction as in the present embodiment can be achieved by optimizing film deposition conditions or etching conditions during formation of the variable resistance film VR. For example, a structure of the variable resistance film VR shown in FIG. 10 can be formed if the place a101 is not completely filled and film deposition is performed in a state where a seam is contained, during the manufacturing step shown in FIG. 8.

Figure 12:
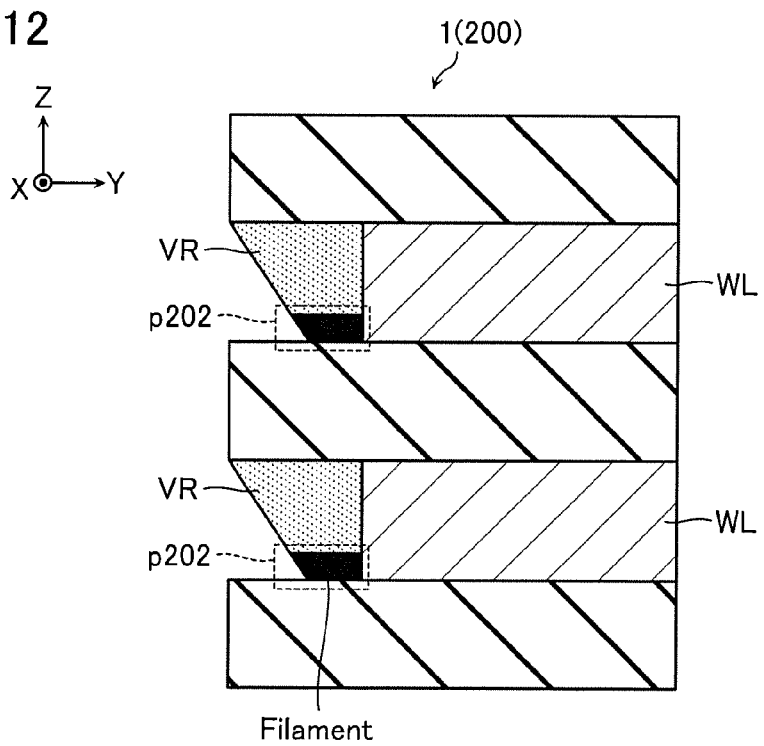
Figure 13:
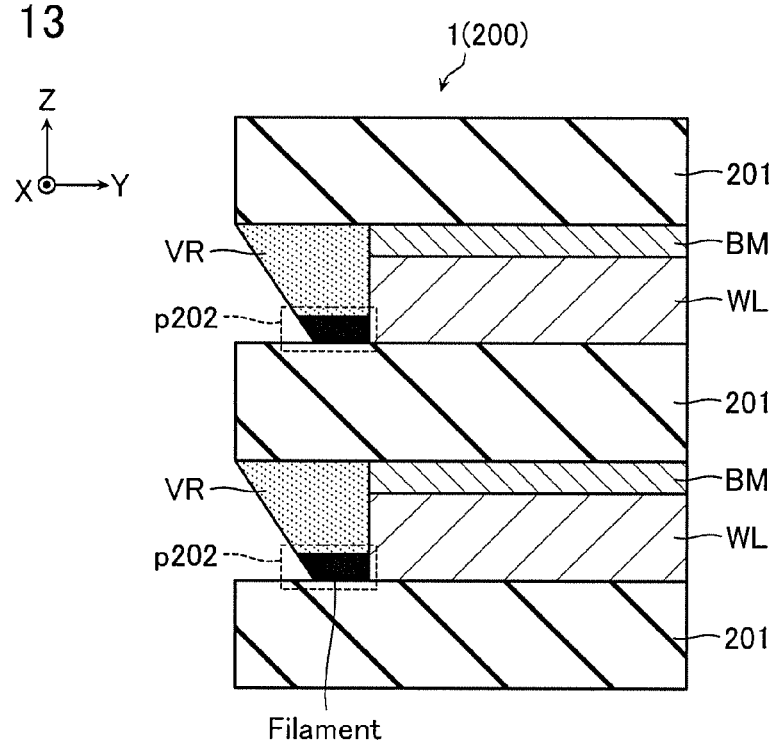

Next, FIG. 12 is an example where a film thickness of the variable resistance film VR gradually decreases from top to bottom, and a thinnest portion p202 of the variable resistance film VR is formed at a lower end of the variable resistance film VR. In this case, as shown in FIG. 12, the filament becomes more easily formed at the lower end of the variable resistance film VR. For example, as shown in FIG. 13, in the case that a barrier metal film BM is disposed at an interface of the inter-layer insulating film 201 and the upper surface of the word line WL, if the thinnest portion p202 is formed beforehand at the lower end of the variable resistance film VR, then the filament can be disposed avoiding the barrier metal film BM. Note that a structure of the variable resistance film VR shown in FIG. 12 can be formed if the variable resistance film 105 other than the place a101 is removed by wet etching during the manufacturing step shown in FIG. 9, for example.

Figure 14:
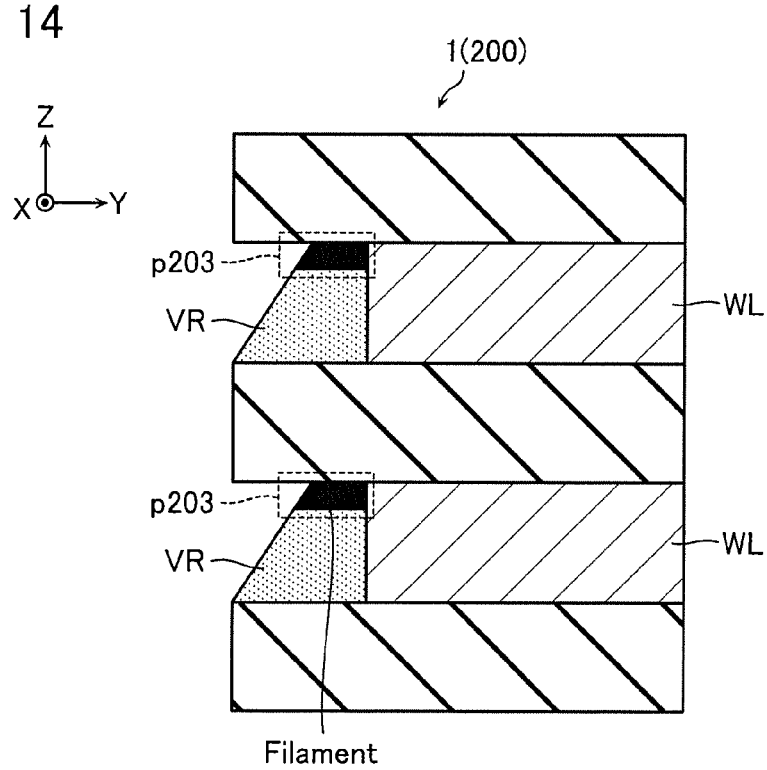
Figure 15:
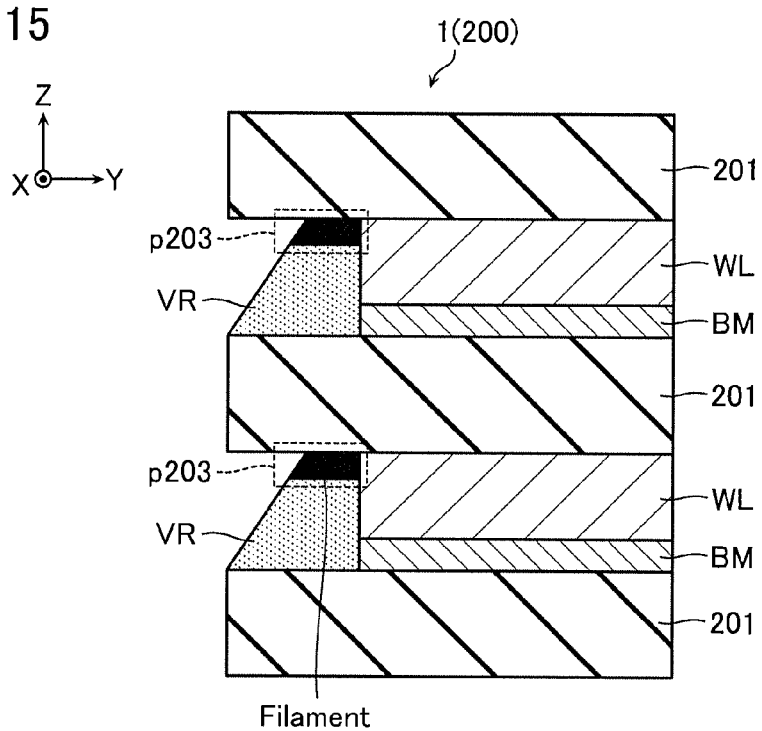

Next, FIG. 14 is an example where a film thickness of the variable resistance film VR gradually increases from top to bottom, and a thinnest portion p203 of the variable resistance film VR is formed at an upper end of the variable resistance film VR. In this case, as shown in FIG. 14, the filament becomes more easily formed at the upper end of the variable resistance film VR. For example, as shown in FIG. 15, in the case that a barrier metal film BM is disposed at an interface of the bottom surface of the word line WL and an upper surface of the inter-layer insulating film 201, if the thinnest portion p203 is formed beforehand at the upper end of the variable resistance film VR, then the filament can be disposed avoiding the barrier metal film BM. Note that a structure shown in FIG. 14 can be formed if the variable resistance film VR is deposited by CVD (Chemical Vapor Deposition) in which conditions such as a chemical species of a supplied vapor phase have been adjusted, during the manufacturing step shown in FIG. 8, for example.

Figure 16:
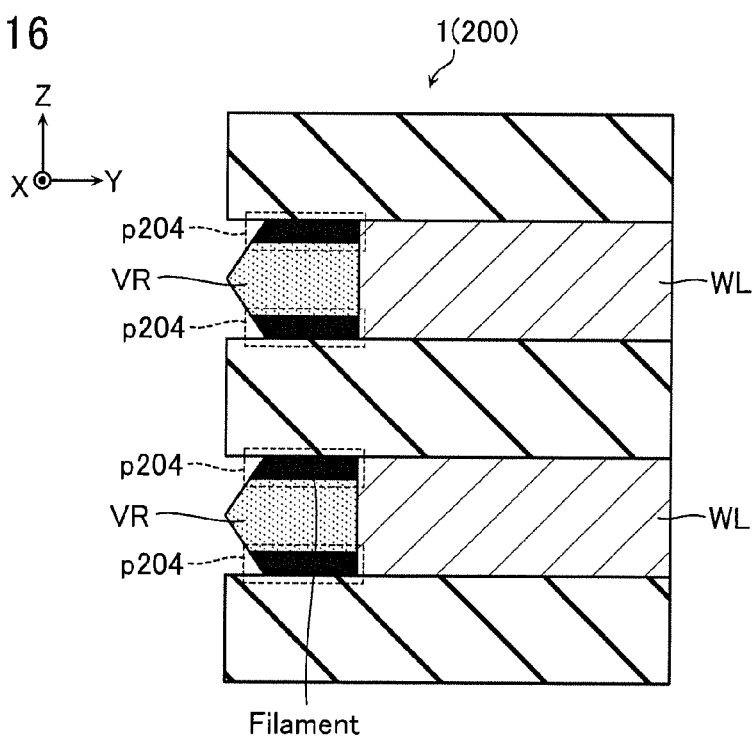

In addition, as shown in FIG. 16, it is also possible that a film thickness of the variable resistance film VR gradually increases the closer the center is approached, and that a thinnest portion p204 is disposed at the lower end and the upper end of the variable resistance film VR. In this case, as shown in FIG. 16, the filament becomes more easily formed at the upper end and the lower end of the variable resistance film VR.

As is clear from the above, the present embodiment not only makes it possible to obtain advantages similar to those of the first embodiment, but also enables the filament of the variable resistance film to be disposed at a place advantageous for electrical characteristics of the memory cell array.

Third Embodiment

In order to form the bit line BL by polysilicon (Poly-Si), it becomes necessary to once deposit amorphous silicon (a-Si), and then perform annealing processing for crystallizing this amorphous silicon.

In this respect, in the case of the first embodiment, the conductive film 104 which is to be the bit line BL is deposited after the variable resistance film 105 has been deposited, hence the variable resistance film 105 ends up being affected by annealing of the conductive film 104. Accordingly, a third embodiment describes a semiconductor memory device in which the variable resistance film VR is not affected by annealing processing during bit line BL formation. Note that to distinguish from a memory cell array 1 of another embodiment, the memory cell array 1 of the present embodiment will be assigned with a reference symbol 300.

Figure 17:
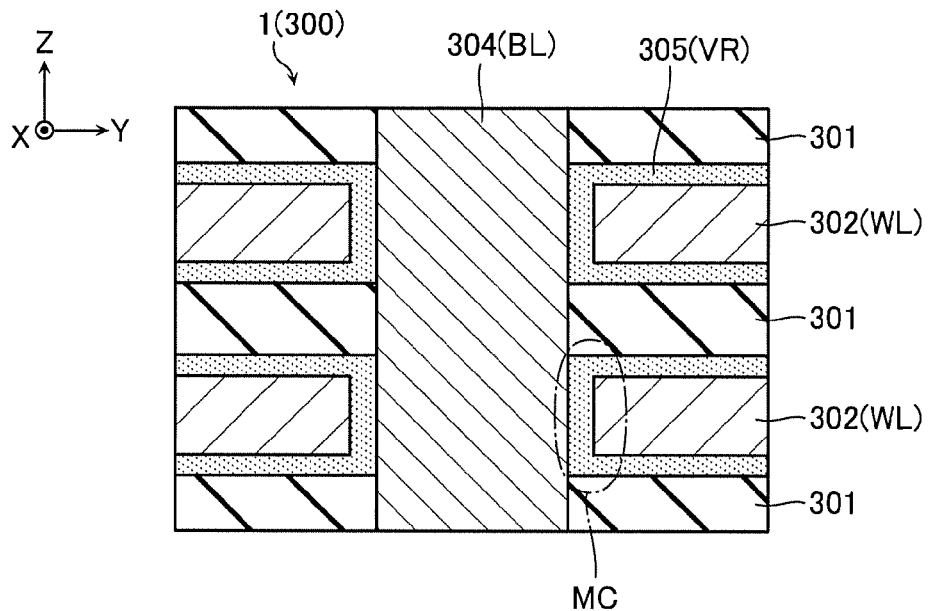
FIG. 17 is a cross-sectional view of a memory cell periphery of a memory cell array of a semiconductor memory device according to a third embodiment.

FIG. 17 is a cross-sectional view in the Y-Z directions of a memory cell periphery of the memory cell array of the semiconductor memory device according to the present embodiment.

The memory cell array 300 of the present embodiment, contrary to the memory cell array 100, includes a variable resistance film VR that covers the upper surface, bottom surface, and a side surface facing the bit line BL (side surface facing the Y direction) of the word line WL. Note that a side surface facing the bit line BL of the variable resistance film VR is formed in an identical plane to a side surface facing the Y direction of an inter-layer insulating film 301 (corresponding to 101 of FIG. 4). Moreover, the variable resistance films VR of the memory cells MC adjacent in the Z direction are separated by the inter-layer insulating film 301 disposed between these memory cells MC.

Next, manufacturing steps of the memory cell array 300 will be described.

FIGS. 18 to 21 are cross-sectional views in the Y-Z directions describing the manufacturing steps of the memory cell array of the semiconductor memory device according to the present embodiment.

Figure 18:
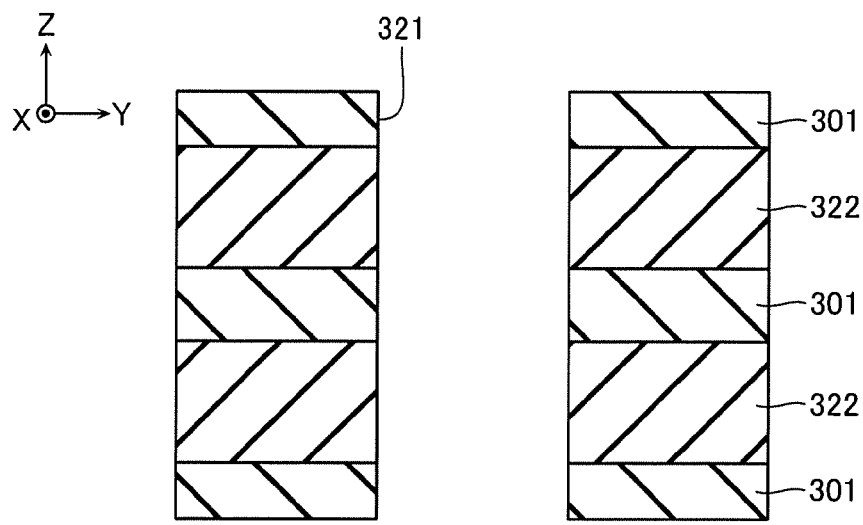
FIGS. 18 to 21 are cross-sectional views describing manufacturing steps of the memory cell array of the semiconductor memory device according to the same embodiment.

First, a plurality of the inter-layer insulating films 301 and sacrifice films 322 are stacked alternately on an unillustrated semiconductor substrate. Now, the sacrifice film 322 is formed by silicon nitride (SiN), for example. Then, as shown in FIG. 18, a trench 321 having the Z direction as its depth direction and having the X direction as its extension direction is formed in a stacked body of the inter-layer insulating films 301 and the sacrifice films 322, by anisotropic etching.

Figure 19:
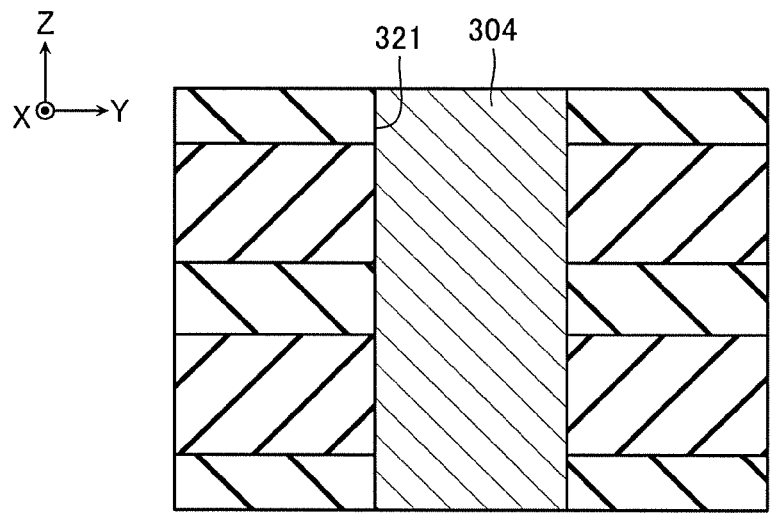

Next, as shown in FIG. 19, a conductive film 304 is implanted in the trench 321. This conductive film 304 is formed by polysilicon (Poly-Si), for example, and functions as the bit line BL. This polysilicon is generated by annealing processing of amorphous silicon (a-Si), for example.

Figure 20:
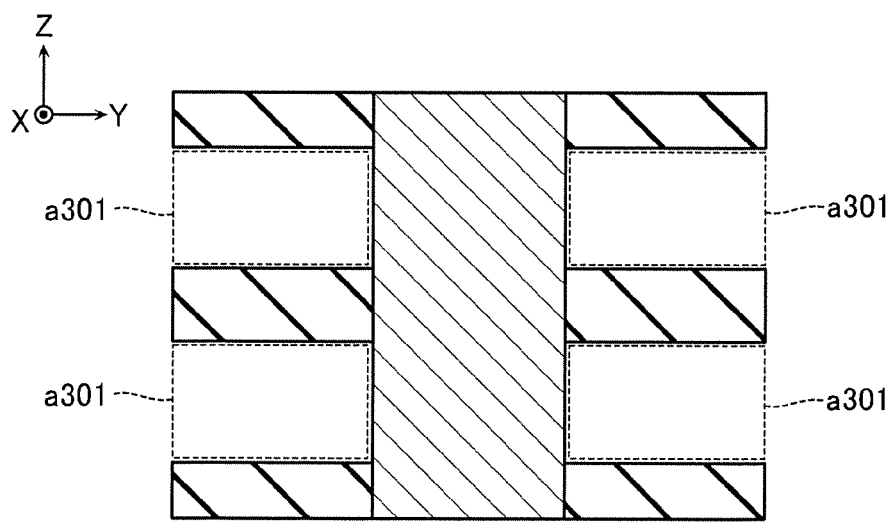

Then, as shown in FIG. 20, the sacrifice film 322 is removed by wet etching using hot phosphoric acid ($H_3PO_4$), for example. Hereafter, a place where there was the sacrifice film 322 will be assumed to be a301.

Figure 21:
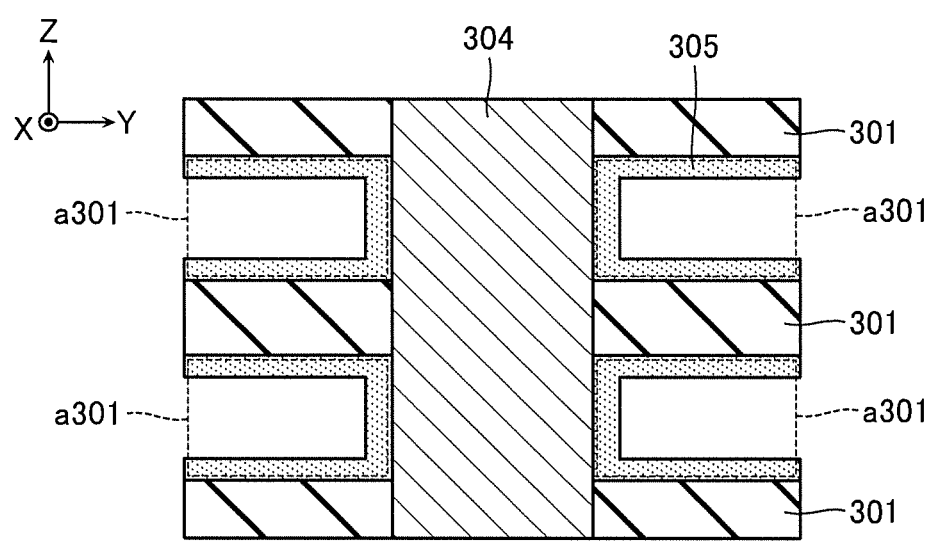

Next, as shown in FIG. 21, a variable resistance film 305 (corresponding to 105 of FIG. 4) is deposited on a bottom surface of an upper-side inter-layer insulating film 301, a side surface of the conductive film 304, and an upper surface of a lower-side inter-layer insulating film 301 which are exposed in the place a301.

Finally, the place a301 where the variable resistance film 305 has been deposited, is implanted with a conductive film 302 (for example, corresponding to 102 of FIG. 4). Now, the conductive film 302 functions as the word line WL.

As a result of the manufacturing steps above, the memory cell array 300 shown in FIG. 17 is formed.

As is clear from the above, the present embodiment makes it possible to obtain similar advantages to those of the first embodiment, such as a reduction in current leak between the word lines WL adjacent in the Z direction and there being no limitation of a combination of a material of the word line WL and a material of the variable resistance film VR. Moreover, since the variable resistance film is deposited after the conductive film (bit line) has been deposited, the present embodiment, contrary to the first embodiment, makes it possible to avoid effects of annealing processing of the conductive film (bit line) on the variable resistance film.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a semiconductor substrate which extends in first and second directions that intersect each other;
a plurality of first wiring lines which are arranged in a third direction that intersects the first direction and the second direction, and which extend in the first direction;
a plurality of second wiring lines which are arranged in the first direction and extend in the third direction; and
a plurality of memory cells disposed at intersections of the first wiring lines and the second wiring lines,
one of the memory cells having a first film whose resistance changes electrically,
a thickness in the second direction of the first film changing with respect to a change of position in the third direction, and
the first films of two of the memory cells adjacent in the third direction being separated between the two memory cells.

2. The semiconductor memory device according to claim 1, wherein
the first wiring lines include a first metal, and
the first film includes an oxide of a second metal different from the first metal.

3. The semiconductor memory device according to claim 1, further comprising
an insulating film disposed between two of the first wiring lines adjacent in the third direction,
wherein the first films of two of the memory cells adjacent in the third direction are separated by the insulating film.

4. The semiconductor memory device according to claim 1, wherein
a thickness in the second direction of the first film is constant with respect to a change of position in the first direction.

5. The semiconductor memory device according to claim 1, wherein
the first film has a first portion whose thickness in the second direction is less than that of another portion of the first film, and a filament is formed in the first portion.

6. The semiconductor memory device according to claim 5, further comprising:
an insulating film disposed between two of the first wiring lines adjacent in the third direction; and
a barrier film disposed between the insulating film and at least one of the two first wiring lines,
wherein the first portion of the first film is in a position different from that of the barrier film in the third direction.

7. The semiconductor memory device according to claim 5, wherein
the first film has a plurality of the first portions.

8. The semiconductor memory device according to claim 5, further comprising
an insulating film disposed between two of the first wiring lines adjacent in the third direction,
wherein the first portion of the first film is more distantly separated from a certain second wiring line in the second direction than a side surface facing the certain second wiring line of the insulating film is.

9. A semiconductor memory device, comprising:
a semiconductor substrate which extends in first and second directions that intersect each other;

a plurality of first wiring lines which are arranged in a third direction that intersects the first direction and the second direction, and which extend in the first direction;

a plurality of second wiring lines which are arranged in the first direction and extend in the third direction; and a plurality of memory cells disposed at intersections of the first wiring lines and the second wiring lines, one of the memory cells having a first film whose resistance changes electrically, the first film covering an upper surface, side surface, and bottom surface of one of the first wiring lines, and the first films of two of the memory cells adjacent in the third direction being separated between the two memory cells.

10. The semiconductor memory device according to claim 9, wherein the first wiring lines include a first metal, and the first film includes an oxide of a second metal different from the first metal.

11. The semiconductor memory device according to claim 9, further comprising an insulating film disposed between two of the first wiring lines adjacent in the third direction, wherein the first films of two of the memory cells adjacent in the third direction are separated by the insulating film.

12. The semiconductor memory device according to claim 9, further comprising two of insulating films sandwiching one of the first wiring lines in the third direction, wherein the first film has a height in the third direction from a position of a bottom surface of one of the two insulating films to a position of an upper surface of the other of the two insulating films.

13. The semiconductor memory device according to claim 9, further comprising an insulating film disposed between two of the first wiring lines adjacent in the third direction, wherein side surfaces facing a certain second wiring line of the two first wiring lines are further separated from the certain second wiring line in the second direction than a side surface facing the certain second wiring line of the insulating film is.

* * * * *